United States Patent
Yin et al.

(10) Patent No.: US 12,062,582 B2
(45) Date of Patent: Aug. 13, 2024

(54) METHOD OF MANUFACTURING SEMICONDUCTOR DEVICES

(71) Applicant: TAIWAN SEMICONDUCTOR MANUFACTURING CO., LTD., Hsinchu (TW)

(72) Inventors: Li-Chao Yin, Hsinchu (TW); Hung-Bin Lin, New Taipei (TW); Hsin-Hsien Wu, Hsinchu (TW); Chih-Ming Ke, Hsinchu (TW); Chyi Shyuan Chern, Taipei (TW); Ming-Hua Lo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 359 days.

(21) Appl. No.: 17/084,628

(22) Filed: Oct. 30, 2020

(65) Prior Publication Data

US 2021/0217670 A1    Jul. 15, 2021

Related U.S. Application Data

(60) Provisional application No. 62/961,576, filed on Jan. 15, 2020.

(51) Int. Cl.
*H01L 21/66* (2006.01)
*G03F 7/00* (2006.01)
(Continued)

(52) U.S. Cl.
CPC .......... *H01L 22/12* (2013.01); *G03F 7/70033* (2013.01); *G03F 7/70616* (2013.01);
(Continued)

(58) Field of Classification Search
CPC ......... H01L 22/20; H01L 22/12; H01L 21/30; G03F 7/70783; G03F 7/70616; G03F 7/70875; G03F 7/70033
See application file for complete search history.

(56) References Cited

U.S. PATENT DOCUMENTS 6,907,742 B2 *  6/2005  Kuo ................. H01L 21/67109
                                                    62/434
8,097,541 B2 *  1/2012  Takagi ............. H01L 21/02046
                                                    438/517

(Continued)

FOREIGN PATENT DOCUMENTS

CN      101512702 A      8/2009
CN      102017070 A      4/2011
(Continued)

OTHER PUBLICATIONS

Y.-L Shen and U. Ramamurty, "Temperature-dependent inelastic response of passivated copper films: Experiments, analyses and implications" Journal of Vacuum Science & Technology B: Microelectronics and Nanometer Structures Processing, Measurement, and Phenomena, vol. 21(4), pp. 1258-1264 (2003); doi:10.1116/1.1574051.

*Primary Examiner* — Michael M Trinh
(74) *Attorney, Agent, or Firm* — STUDEBAKER & BRACKETT PC

(57) ABSTRACT

In a method, a structure including two or more materials having different coefficients of thermal expansion is prepared, and the structure is subjected to a cryogenic treatment. In one or more of the foregoing and following embodiments, the structure includes a semiconductor wafer and one or more layers are formed on the semiconductor wafer.

20 Claims, 19 Drawing Sheets

(51) Int. Cl.
*H01L 21/30* (2006.01)
*H01L 21/322* (2006.01)

(52) U.S. Cl.
CPC .......... *G03F 7/70783* (2013.01); *H01L 21/30* (2013.01); *H01L 21/3228* (2013.01); *H01L 22/20* (2013.01)

(56) References Cited

U.S. PATENT DOCUMENTS

| | | | |
|---|---|---|---|
| 9,607,838 | B1 | 3/2017 | Lin et al. |
| 2003/0047763 | A1* | 3/2003 | Hieda ............... H01L 21/28079 |
| | | | 257/E21.324 |
| 2008/0061387 | A1 | 3/2008 | Pardo |
| 2010/0243336 | A1 | 9/2010 | Dourfaye et al. |
| 2011/0014775 | A1 | 1/2011 | Akiyama et al. |
| 2012/0132921 | A1 | 5/2012 | Chen et al. |
| 2012/0171875 | A1* | 7/2012 | Gan ................... H01L 21/67288 |
| | | | 257/E21.328 |
| 2014/0007661 | A1* | 1/2014 | Kobayashi ............... G01N 1/28 |
| | | | 250/208.1 |
| 2015/0020877 | A1 | 1/2015 | Moslehi et al. |
| 2018/0061698 | A1 | 3/2018 | Tsai et al. |
| 2018/0308720 | A1* | 10/2018 | Mbanso ............ H01L 21/02043 |
| 2020/0006304 | A1 | 1/2020 | Chang et al. |
| 2020/0391485 | A1* | 12/2020 | Couillard ............... B32B 37/144 |

FOREIGN PATENT DOCUMENTS

| | | |
|---|---|---|
| CN | 102479683 A | 5/2012 |
| CN | 103918088 A | 7/2014 |
| CN | 107799465 A | 3/2018 |
| CN | 109830457 A | 5/2019 |
| CN | 110646898 A | 1/2020 |
| JP | 2007311385 A | 11/2007 |

\* cited by examiner

METHOD OF MANUFACTURING SEMICONDUCTOR DEVICES

CROSS-REFERENCE TO RELATED APPLICATIONS

This application claims priority to U.S. Provisional Patent Application No. 62/961,576 filed Jan. 15, 2020, the entire disclosure of which is incorporated herein by reference.

BACKGROUND

As the semiconductor industry has progressed into nanometer technology process nodes in pursuit of higher device density, higher performance, and lower costs, challenges from both fabrication and design issues have resulted in the development of high-resolution patterning operations, such as extreme ultraviolet (EUV) lithography. In a lithography operation, a focus margin is one of the critical issues. The focus margin is affected by the surface topography of a substrate (wafer) and/or deformation (e.g., warpage) of the substrate. Thus, it is important to obtain a flatter surface of the substrate in an advanced lithography operation. Further, deformation and/or warpage of the substrate also affects other semiconductor manufacturing operations, and may reduce reliability of semiconductor devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
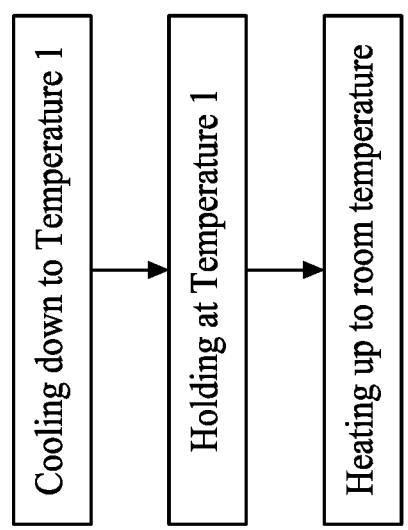
FIG. 1A is a flow of a cryogenic treatment according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

During a semiconductor device manufacturing process, various thermal processes are performed. When a thermal process (heating or annealing) is performed on a multi-layer structure or a patterned structure over a semiconductor wafer or substrate, mismatch in coefficients of thermal expansion (CTE) induces a high internal stress, which in turn causes a wafer or substrate warpage (bowing, bending, deformation) or deformation as a consequence. Such a warpage may impact a quality and a yield of semiconductor integrated circuit (IC) manufacturing or packaging processes.

Some methods to reduce warpage includes (1) changing the process and/or materials, and (2) a hot embossing process which applies high temperature with an external force. However, these methods are not preferable for high volume manufacturing, because the change of process/materials would narrow process windows, and the hot embossing process may reduce yield and may not work on a structure with a metal rich layer.

In the present disclosure, a cryogenic treatment is applied to a semiconductor wafer during a sequential manufacturing operation of a semiconductor device, semiconductor chips before and/or after a dicing process and/or chips molded in an IC package, to reduce internal stress and/or warpage of wafers, chips and/or substrates.

Figure 1B:
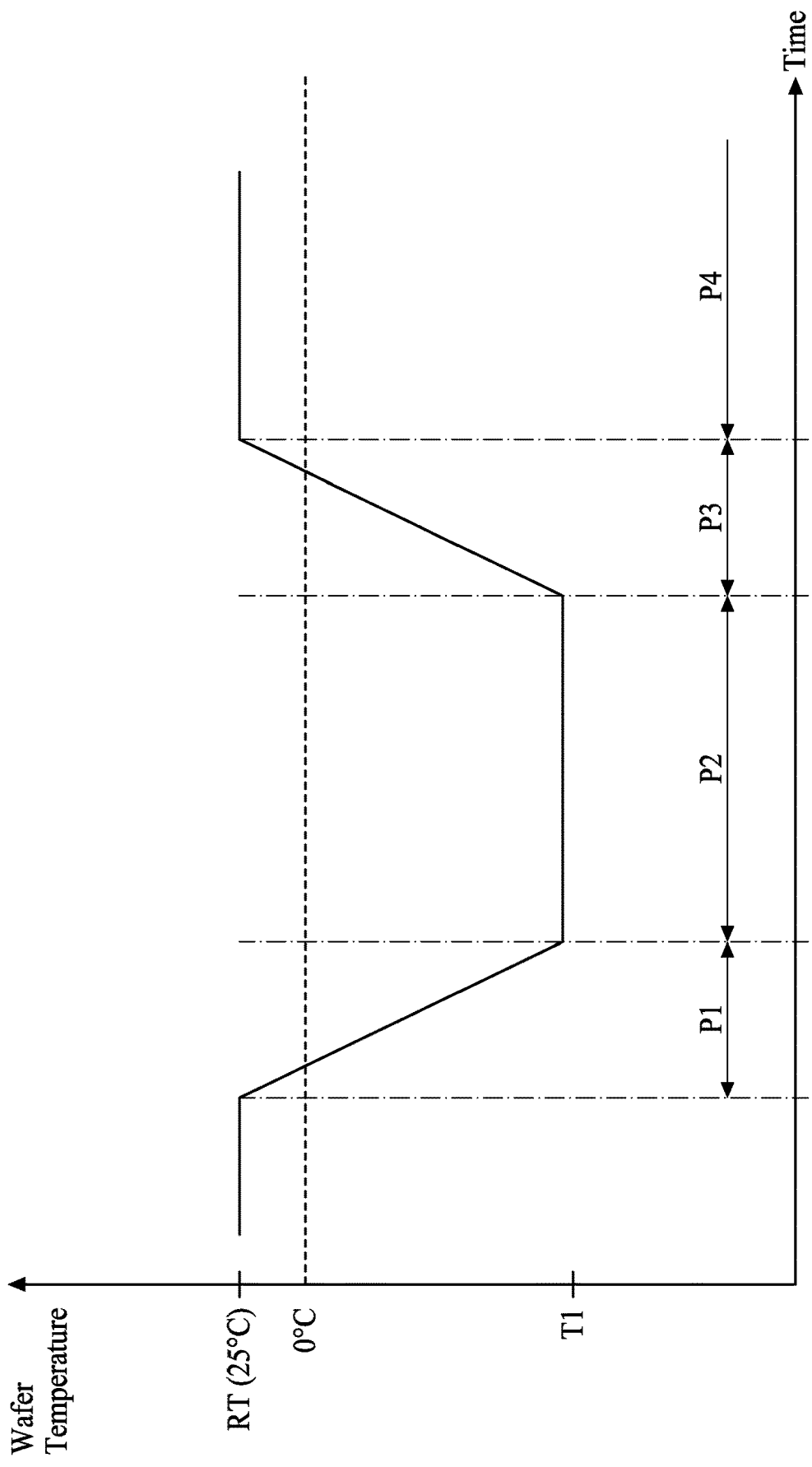
FIG. 1B shows a temperature change in a cryogenic treatment according to an embodiment of the present disclosure.

FIG. 1A is a flow of a cryogenic treatment according to an embodiment of the present disclosure. FIG. 1B shows a temperature change in a cryogenic treatment according to an embodiment of the present disclosure.

In the present disclosure, a cryogenic treatment (process) includes cooling down the subject structure (e.g., a semiconductor wafer with one or more films thereon) from room temperature (e.g., 25° C.) to a low temperature, holding the structure at the low temperature, and heating up the structure to the room temperature, as shown in FIGS. 1A and 1B. In some embodiments, the temperature of the wafer or substrate before the cryogenic treatment operation is higher or lower than room temperature.

The cooling process increases stress and/or deformation in the subject structure. Then, the subject structure is held at the low temperature, during which the internal stress is reduced or relaxed. Then, the heating process further decreases the stress and deformation. If the materials of the subject structure exhibits a plastic deformation effect, the stress/deformation after the cryogenic treatment is reduced compared with the initial stress/deformation. The cryogenic treatment provides a temperature dependent stress (through coefficient of thermal expansion mismatch) and induces plastic deformation, and then reduces internal stress at room temperature by the plastic deformation effect.

In some embodiments, the low temperature (holding temperature) T1 is set in a range from about −10° C. to about −273° C., depending on desired stress reduction and/or various coolants or cooling methods. In other embodiments, the holding temperature T1 is set in a range from about −20° C. to about −269° C. In other embodiments, the holding temperature T1 is set in a range from about −20° C. to about −196° C. In certain embodiments, the holding temperature T1 is set in a range from about −30° C. to about −100° C. In certain embodiments, the holding temperature T1 is set in a range from about −150° C. to about −200° C.

The holding time duration P2 is in a range from about 0.1 min to about 120 min in some embodiments, and is in a range from about 1 min to about 60 min in other embodiments. In other embodiments, the holding time duration P2 is in a range from about 2 min to about 30 min. In certain embodiments, the holding time duration P2 is in a range from about 5 min to about 10 min. If the holding time duration P2 is shorter than these ranges, effect of warpage reduction may not be sufficient, and if the holding time duration P2 is greater than these ranges, it would reduce process efficiency.

A rate of decreasing the temperature (cooling rate) in a time period P1 is in a range from about −0.1° C./min to about −100° C./min in some embodiments. In other embodiments, the rate of decreasing the temperature in the time period P1 is in a range from about −1° C./min to about −50° C./min. In certain embodiments, the rate of decreasing the temperature in the time period P1 is in a range from about −5° C./min to about −10° C./min. The cooling rate is too small, effect of warpage reduction may not be sufficient, and if the cooling rate is too high, it may cause damage (e.g., crack) to the wafer or substrate.

A rate of increasing the temperature (heating rate) in a time period P3 is in a range from about 0.1° C./min to about 100° C./min in some embodiments. In other embodiments, the rate of increasing the temperature in the time period P3 is in a range from about 1° C./min to about 50° C./min. In certain embodiments, the rate of increasing the temperature in the time period P3 is in a range from about 5° C./min to about 10° C./min. If the heating rate is too small, effect of warpage reduction may not be sufficient, and if the heating rate is too high, it may cause damage (e.g., crack) to the wafer or substrate.

The cooling rate is equal to the heating rate in some embodiments (in absolute value), and the cooling rate is greater or smaller than the heating rate in other embodiments. The cooling rate and/or the heating rate can be changed during the cooling operation and/or the heating operation. In some embodiments, the temperature of the wafer or substrate at the period P4 is higher or lower than the room temperature.

Figure 1C:
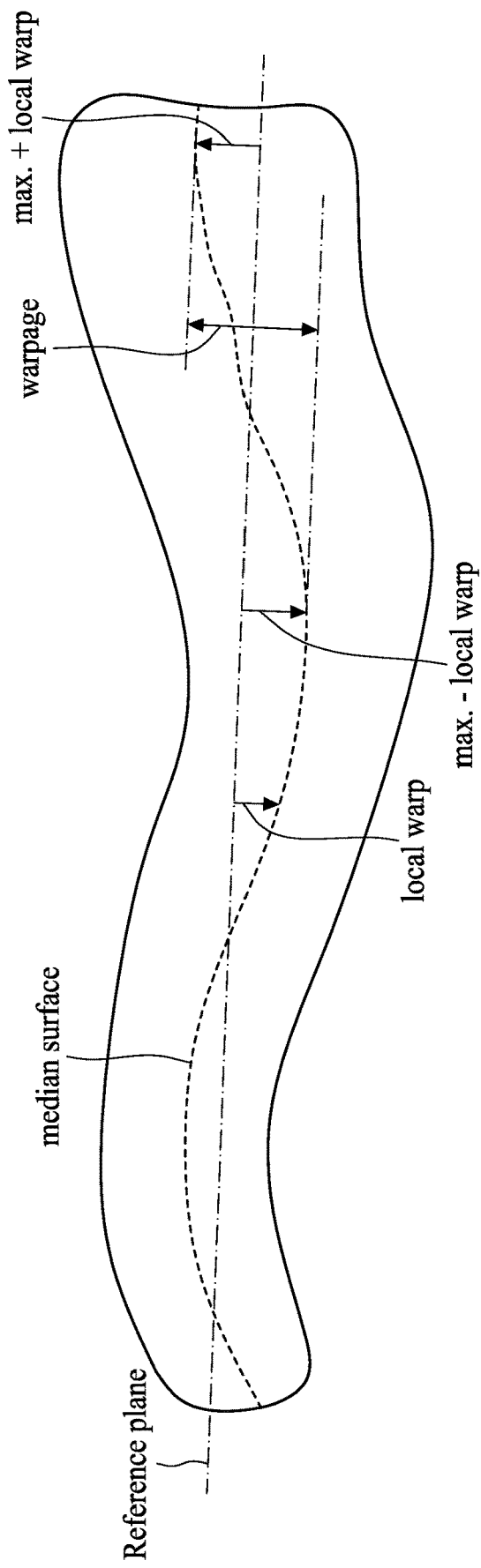
FIG. 1C shows a definition and measurement of warpage.

In some embodiments, the warpage is defined as the differences between the maximum and minimum distances of the median surface of a free, unclamped wafer from a reference place, as shown in FIG. 1C. The location of the median surface is calculated by a three point plane around the edge of the wafer, or by performing a least squares fit calculation of median surface data acquired during the measurement scan. Warpage is then calculated by finding the maximum deviation from the reference plane and the minimum differentiation from the reference plane. The maximum differentiation is defined as the largest distance above the reference plane and is a positive number, and the minimum differentiation is the largest distance below the reference plane and is a negative number. Measurement tools and measurement methods of warpage are known to one of ordinary skill in the art. In some embodiments, the wafer is simply bent having a bow and the warpage is similarly defined and measured for the bow shape. In some embodiments, the warpage is measured on a back side or a front side or on both sides.

In some embodiments, after the cryogenic treatment operation, the value of warpage is reduced but may not be zero. In some embodiments, the residual warpage is in a range from about 1 μm to about 10000 μm, and is in a range from about 10 μm to about 1000 μm. In other embodiments, the residual warpage is in a range from about −1 μm to about −10000 μm and is in a range from about −10 μm to about −1000 μm in other embodiments. The minus sign indicate the warpage is convex.

Figure 1D:
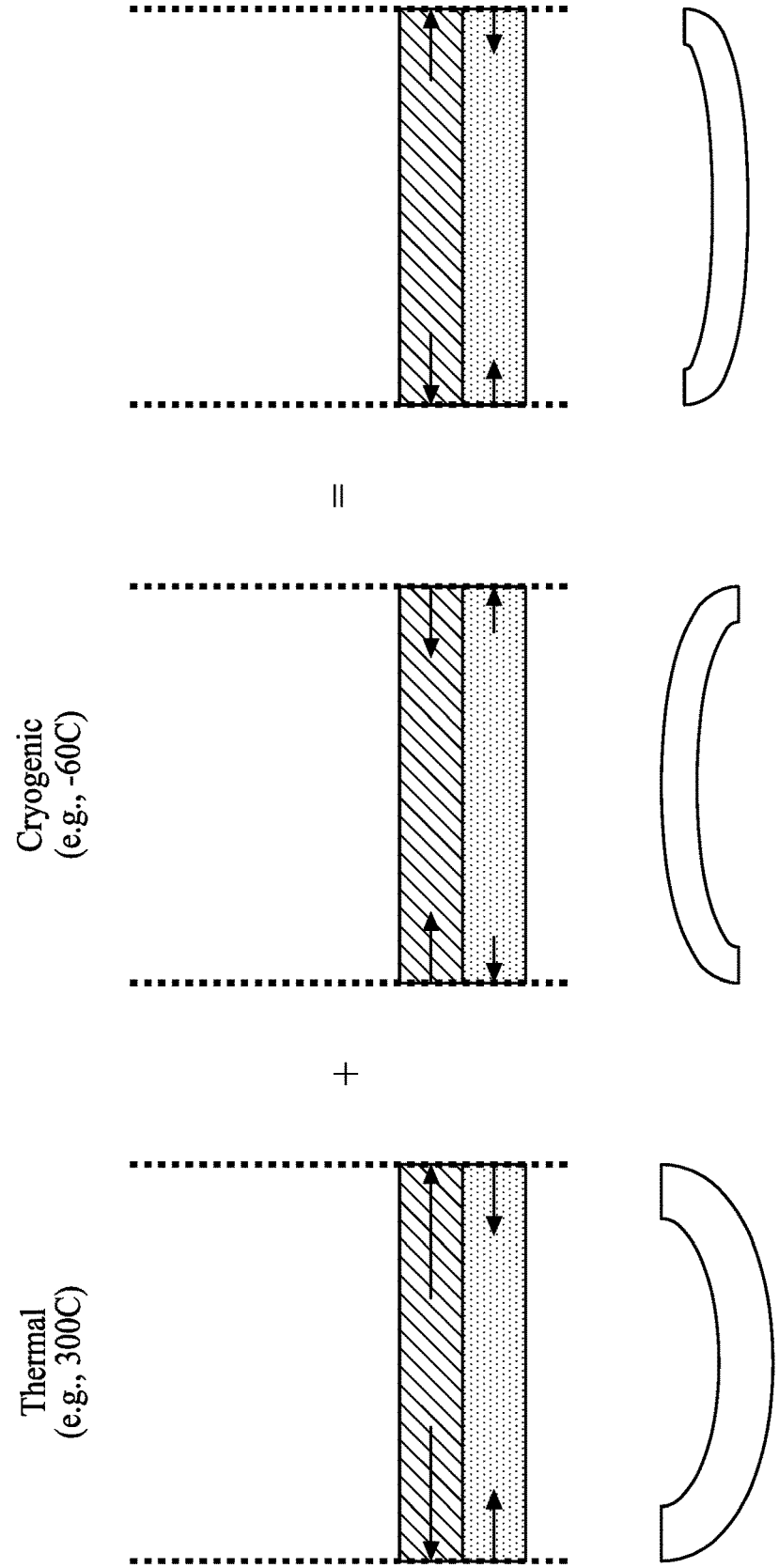
FIGS. 1D and 1E show schematic diagrams explaining effects of the cryogenic treatment.

FIG. 1D shows a conceptual diagram explaining effects of the cryogenic treatment. As shown in FIG. 1D, a metal layer is formed over a silicon wafer. The metal film formation includes a thermal process, for example, heating the wafer at 300° C. Then, the wafer is cooled down to the room temperature. Due to a difference between the coefficients of thermal expansion of the metal layer and the silicon wafer, the entire wafer bends convex downward (bowing warpage). On the other hand, the silicon wafer with the metal film is cooled at very low temperature, for example, −60° C., due to a difference between the coefficients of thermal expansion of the metal layer and the silicon wafer, the entire wafer has internal stress to bend the wafer concave downward. After the cryogenic treatment operation (the temperature is at the room temperature), the entire warpage (bowing) is reduced as shown in FIG. 1D.

Figure 1E:
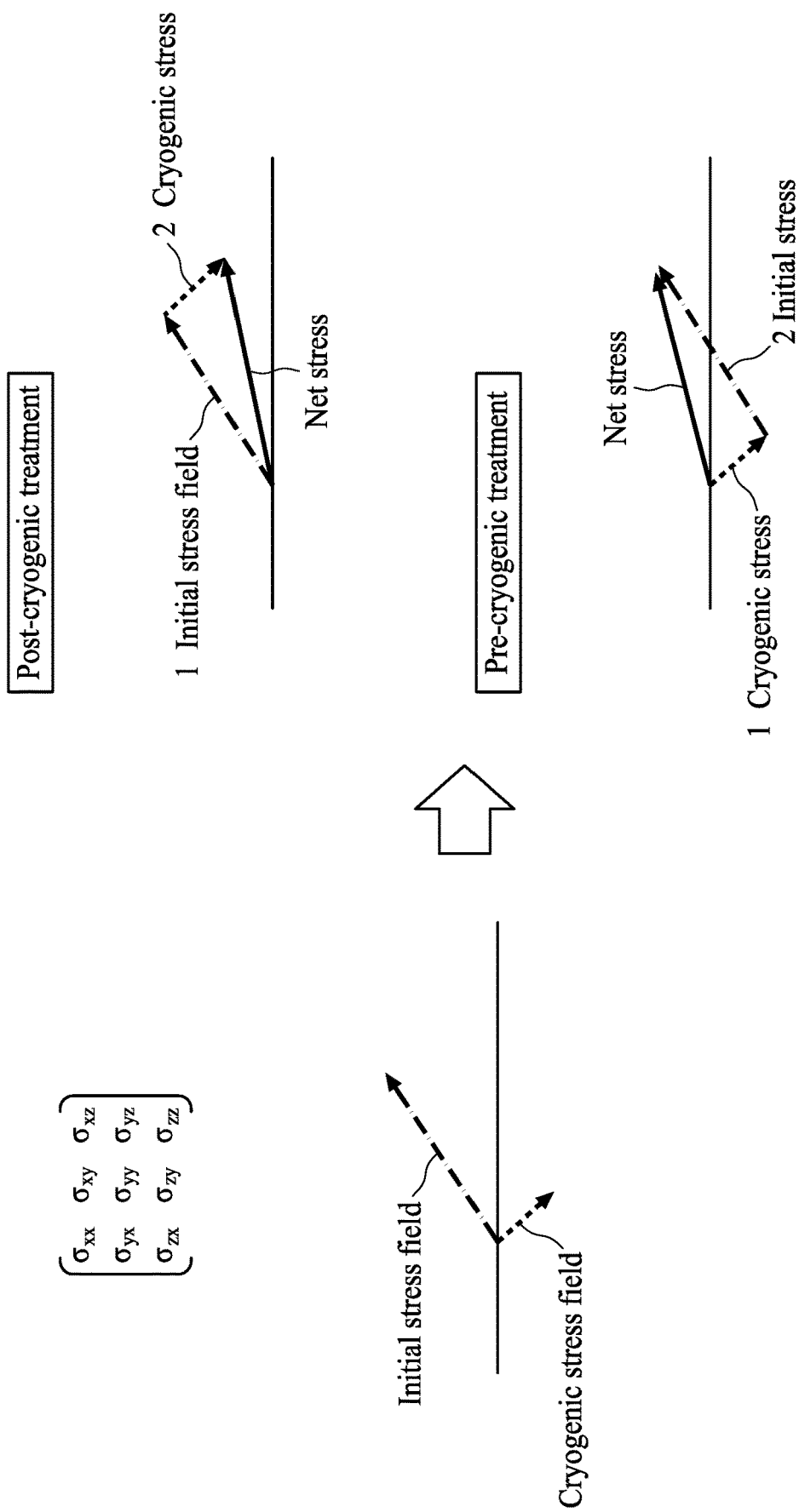

FIG. 1E shows another schematic diagram explaining the effects of the cryogenic treatment. The vectors show the stresses, which may be indicated by a matrix of $\sigma_{xx}$, $\sigma_{xy}$, $\sigma_{xz}$, $\sigma_{yx}$, $\sigma_{yy}$, $\sigma_{yz}$, $\sigma_{zx}$, $\sigma_{zy}$, and $\sigma_{zz}$. As shown, a wafer or substrate subjected to semiconductor manufacturing operations may exhibit a thermal stress, which may cause warpage (deformation) of the wafer or substrate. On the other hand, the cryogenic treatment causes a stress having different directions than the thermal stress. By adjusting parameters of the cryogenic treatment, it is possible to control the directions of the cryogenic stress to compensate (reduce) the initial thermal stress in the wafer or substrate. Thus, by performing a cryogenic treatment operation on the wafer or substrate after a thermal treatment would reduce the net (total) stress. Similarly, by performing a cryogenic treatment operation on the wafer or substrate before a thermal treatment would reduce the net (total) stress.

Figure 2A:
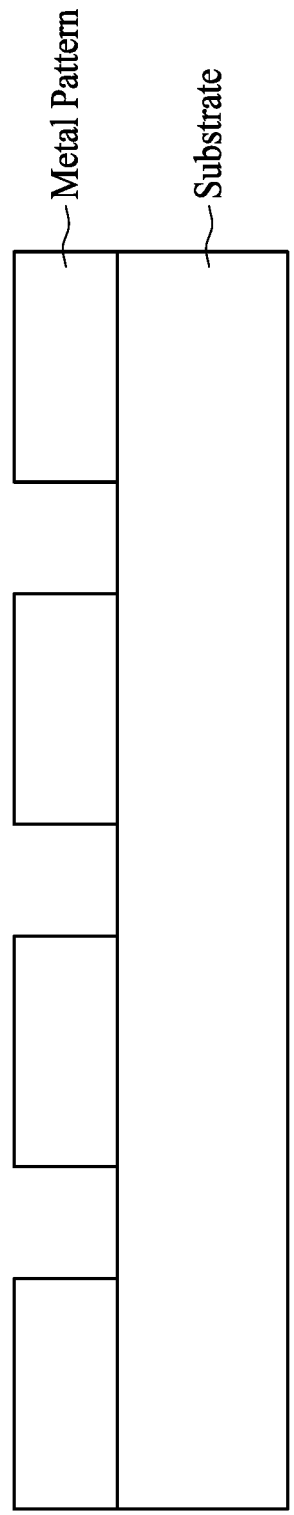
FIG. 2A shows a sample structure to measure effects of a cryogenic treatment according to embodiments of the present disclosure.

FIGS. 2A-2C and 3 show the effect on warpage reduction by the cryogenic treatment operation according to embodiments of the present disclosure. FIG. 2A shows a sample structure to measure effects of a cryogenic treatment according to embodiments of the present disclosure.

Figure 2B:
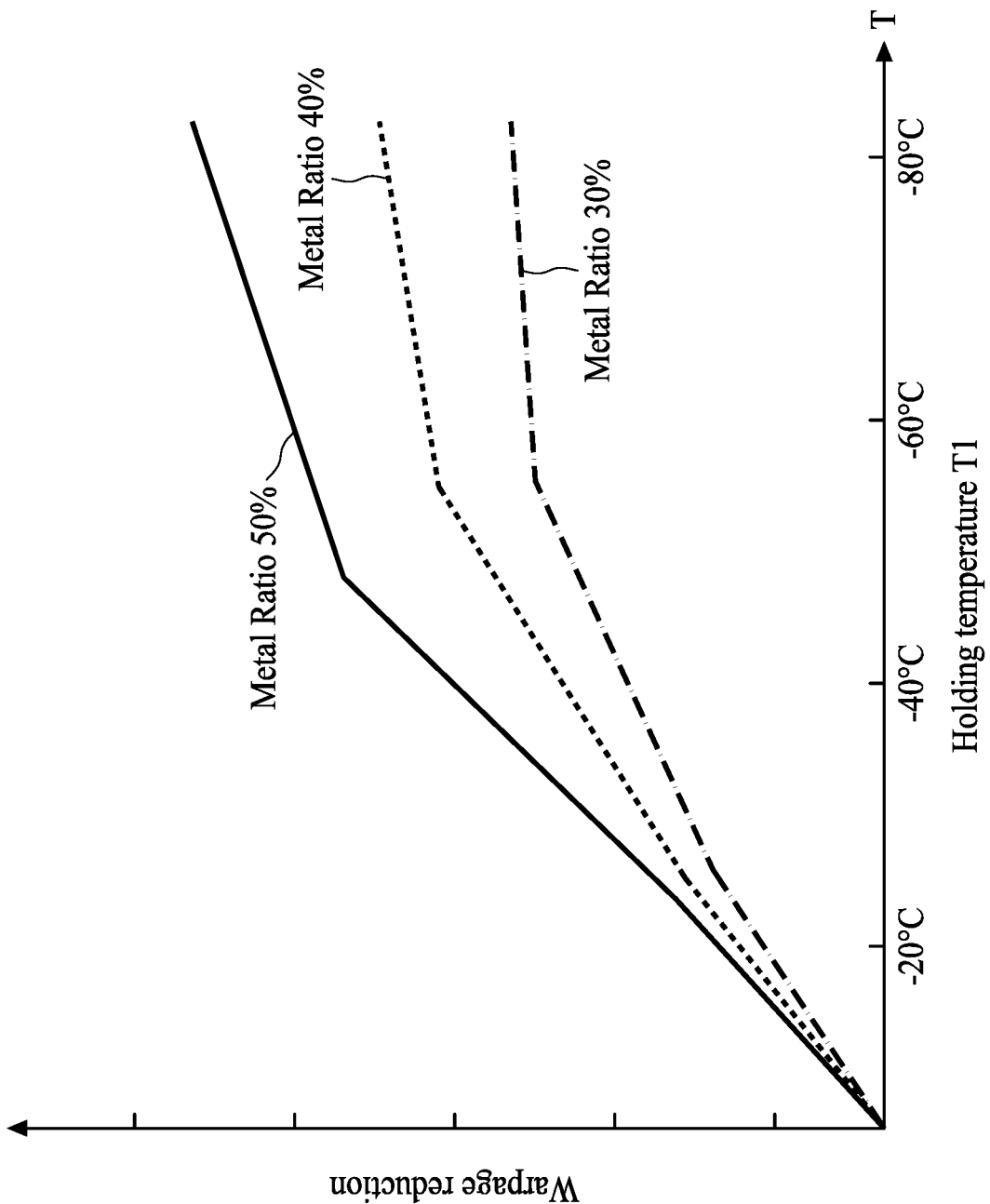
FIGS. 2B and 2C show the effect of a cryogenic treatment operation in a reduction of warpage with respect to different metal pattern ratios according to embodiments of the present disclosure.
Figure 2C:
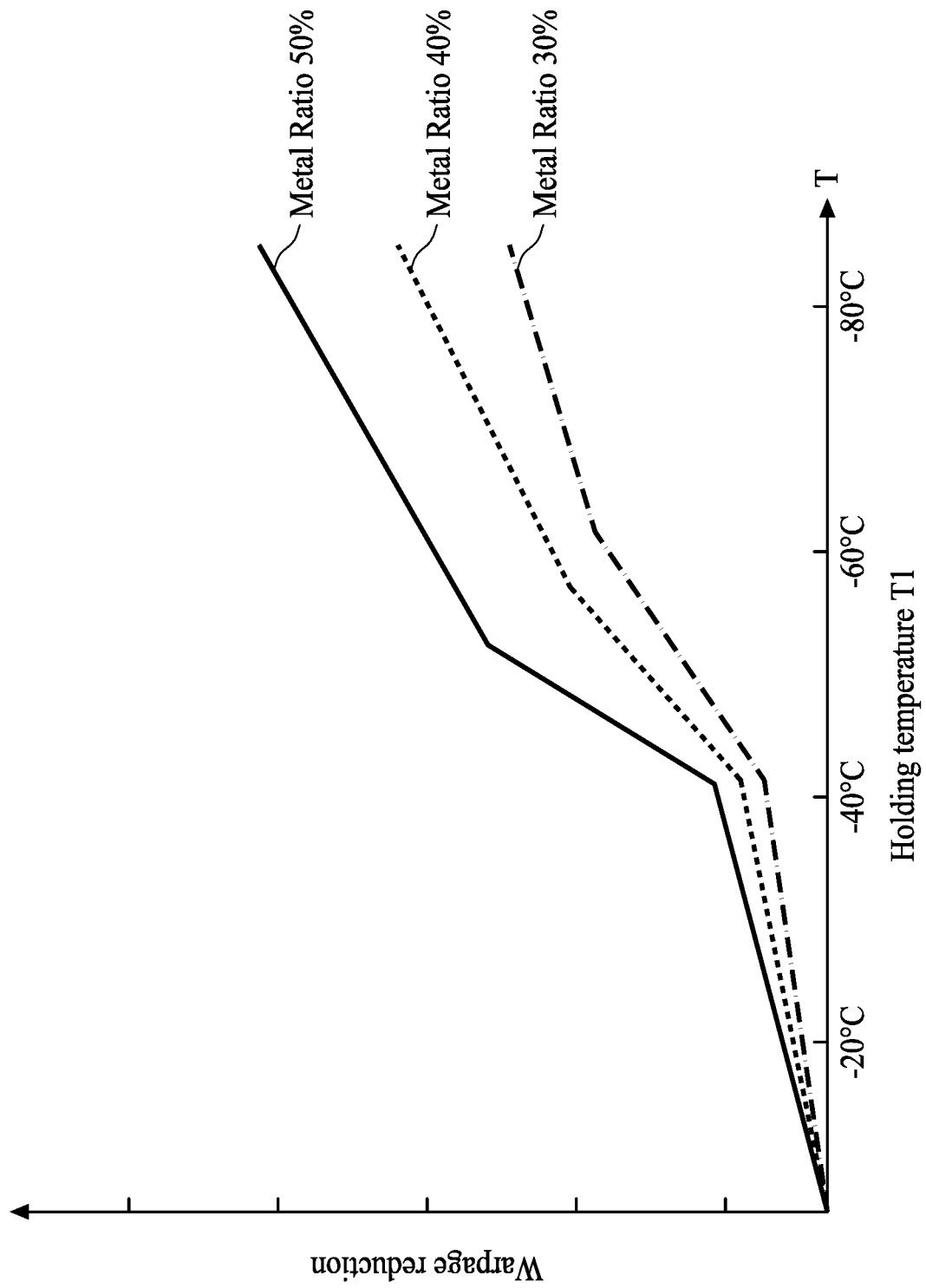

In some embodiments, a metal layer is formed over a wafer or substrate as shown in FIG. 2A. The wafer or substrate is a silicon wafer in some embodiments. In some embodiments, the metal layer is patterned. Depending on the patterns, metal ratio (metal pattern area over the entire wafer or substrate area) can be varied. FIGS. 2B and 2C show effect of a cryogenic treatment operation in a reduction of warpage with respect to different metal materials and different metal pattern ratios according to embodiments of the present disclosure. As shown in FIGS. 2A and 2B, the warpage reduction depends on the pattern ratio and/or materials, as well as the holding temperatures T1.

Figure 3:
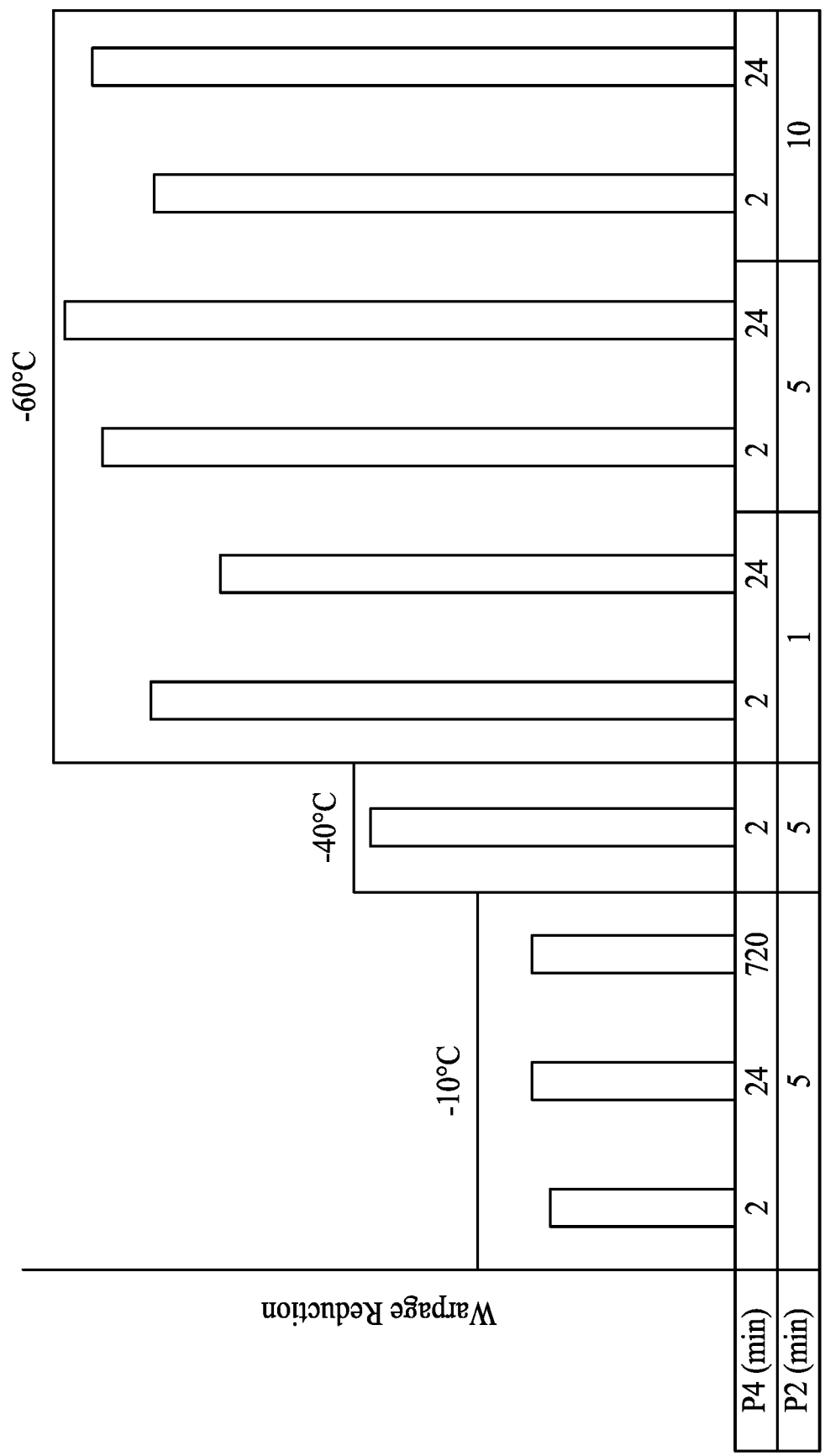
FIG. 3 shows the effect of a cryogenic treatment operation in a reduction of warpage with respect to different conditions according to embodiments of the present disclosure.

FIG. 3 shows the effect of a cryogenic treatment operation in the reduction of warpage with respect to different conditions according to embodiments of the present disclosure. In FIG. 3, the time period P4 is a time duration after the wafer or substrate returns to the room temperature after the cryogenic treatment operation to the warpage measurement timing. In some embodiments, the time prior to P4 corresponds to the time duration between the cryogenic treatment operation and the next process operation.

As shown in FIG. 3, lower holding temperatures provide the higher warpage reduction in some embodiments. In some embodiments, the warpage reduction effect shows no specific dependency on the time duration P4, which means that the warpage reduction effect is stable after the cryogenic treatment operation is performed.

In the present disclosure, the structure subjected to the cryogenic treatment includes a semiconductor wafer (6 inches, 8 inches, 12 inches or the like), a semiconductor chip diced from a wafer, a semiconductor package in which a semiconductor chip is sealed, a photo mask, a transparent substrate (e.g., a glass substrate) for a display device (liquid crystal display, light emission device display, and the like) and/or circuit board on which one or more electronic devices are disposed.

In some embodiments, the semiconductor wafer or substrate includes a single crystalline semiconductor layer on at least its surface portion. The wafer or substrate includes a single crystalline semiconductor material such as, but not limited to Si, Ge, SiGe, GaAs, InSb, GaP, GaSb, InAlAs, InGaAs, GaSbP, GaAsSb and InP. In other embodiments, the wafer or substrate is a silicon-on-insulator (SOI), which is used to manufacture a semiconductor device and/or a micro electromechanical system.

In some embodiments, a photo mask includes a transparent substrate made of a glass, quartz or other low thermal expansion materials. A photo mask includes a metallic layer, such as a Cr based material layer in some embodiments. In other embodiments, a photo mask is a reflective mask and includes a multilayer structure of Si and Mo, Ta, a Ta alloy and/or Ru.

The semiconductor package includes a molded resin (e.g., polyimide, epoxy resin), ceramic (e.g., alumina), metal, conductive frame and leads and other materials. As set forth above, different materials have different coefficients of thermal expansion.

In some embodiments, although the warpage is reduced by the cryogenic treatment, a residual warpage may remain (warpage is not zero).

Figure 4A:
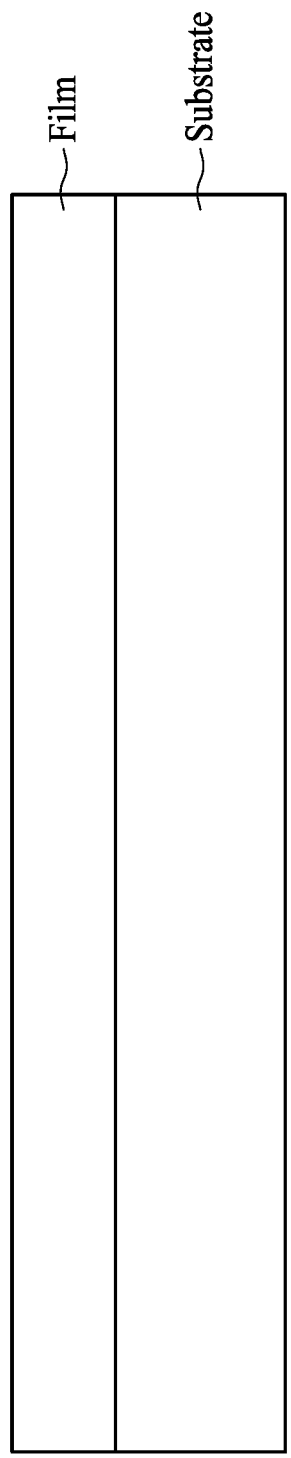
FIGS. 4A, 4B and 4C show various structures subjected to a cryogenic treatment according to embodiments of the present disclosure.
Figure 4B:
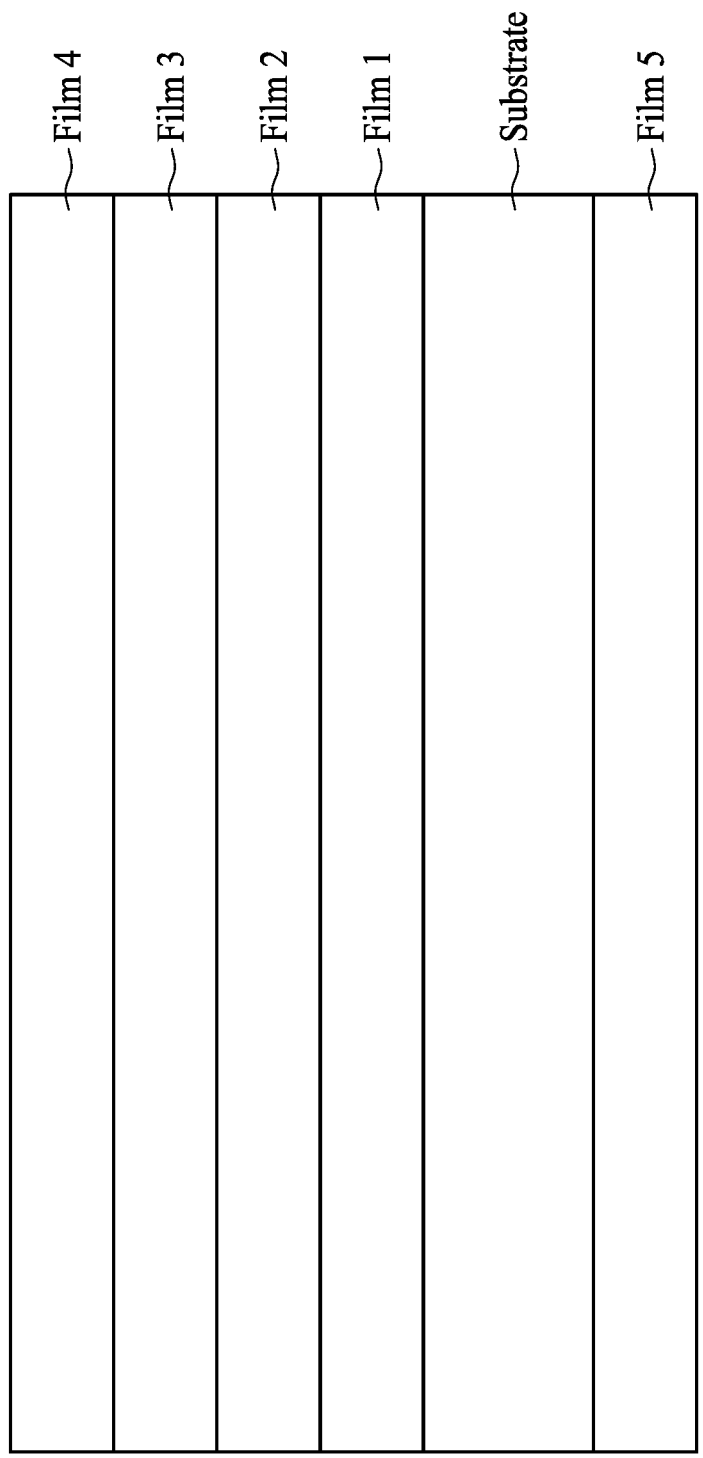
Figure 4C:
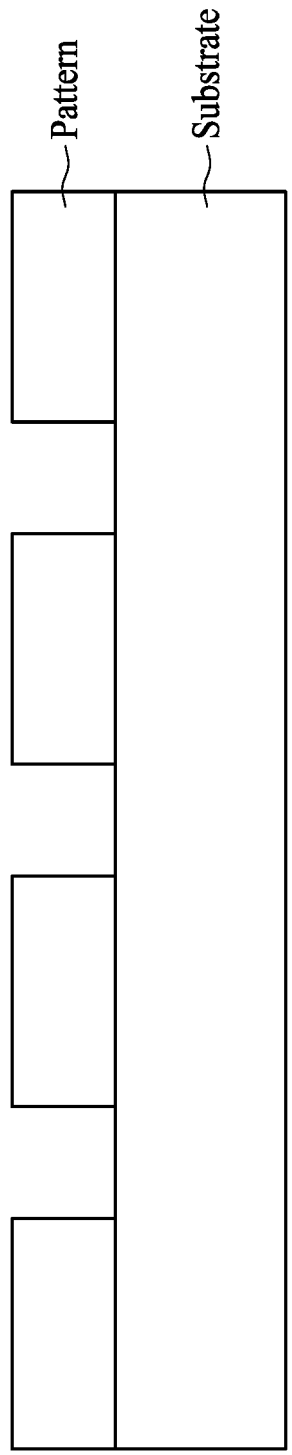

FIGS. 4A, 4B and 4C show various structures appearing during a semiconductor manufacturing operation which are subjected to a cryogenic treatment according to embodiments of the present disclosure.

In some embodiments, a wafer or substrate includes a semiconductor wafer, a semiconductor substrate (chip), a glass substrate, a polymer substrate and the like. In some embodiments, the semiconductor wafer or substrate is at least partially doped with impurities.

In some embodiments, one or more films (layers) are formed on the front surface of the wafer or substrate and/or the back surface of the wafer or substrate as shown in FIGS. 4A and 4B. The film includes an insulating layer, a metallic layer including a conductive metal alloy and metal, or a semiconductor layer. The insulating layer includes silicon oxide, silicon nitride, SiON, SiOC, SiOCN, aluminum oxide, AlON, high-k dielectric layer (e.g., $HfO_2$, HfSiO, HfSiON, HfTaO, HfTiO, HfZrO, zirconium oxide, titanium oxide, and hafnium dioxide-alumina ($HfO_2$—$Al_2O_3$) alloy) or low-k dielectric layer. In other embodiments, the insulating layer includes a ferroelectric layer, such as, $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), or $Ta_2O_5$. In other embodiments, the insulating layer is an organic layer.

In some embodiments, the metallic layer includes W, Cu, Ti, Ag, Al, Mn, Co, Pd, Ni, Re, Ir, Ru, Pt, Zr, Au, Ag, TiN, WN, TaN, TiAl, TiAlN, TaC, TaCN, TaSiN, TiAlC, TaAlC, silicide, alloys thereof, such as Ti—Al, Ru—Ta, Ru—Zr, Pt—Ti, Co—Ni, $WN_x$, $TiN_x$, $MoN_x$, $TaN_x$, or $TaSi_xN_y$, and any other suitable material.

In some embodiments, the semiconductor layer includes single crystalline, polycrystalline or amorphous Si, Ge, Group-IV compound semiconductors (silicon germanium (SiGe), silicon carbide (SiC), silicon germanium carbide (SiGeC), GeSn, SiSn, SiGeSn)), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide(GaInP)), which is doped or non-doped.

The films are formed by thermal oxidation, thermal or plasma nitridation, physical vapor deposition (PVD), such as a sputtering method, chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), molecular beam epitaxy, plating, and/or other processes.

In some embodiments, one or more layers are patterned as shown in FIG. 4C. The difference in CTEs causes internal stress and/or warpage and non-uniform structures (patterns or doped regions) also cause internal stress and/or warpage.

Figure 5:
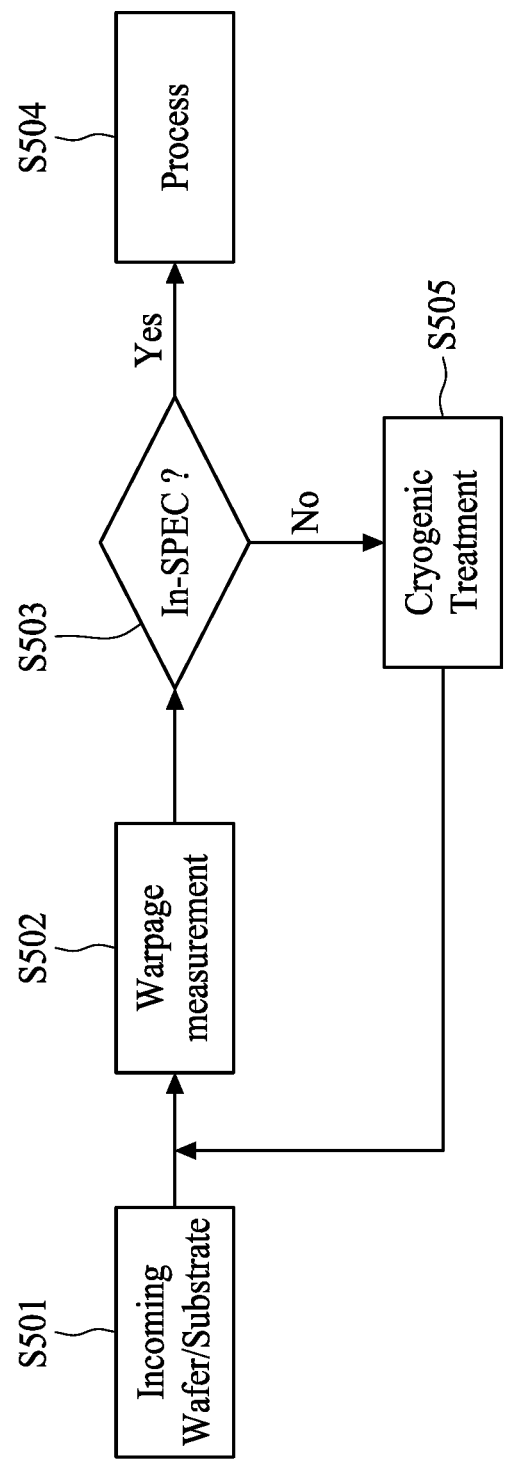
FIG. 5 shows a process flow of a cryogenic treatment during semiconductor device manufacturing operation according to an embodiment of the present disclosure.

FIG. 5 shows a process flow of a cryogenic treatment during semiconductor device manufacturing operation according to an embodiment of the present disclosure.

In some embodiments, a wafer or substrate is received as an incoming wafer or substrate at S501 of FIG. 5. In some embodiments, the incoming wafer is a bare Si wafer before a semiconductor manufacturing process is performed. In some embodiments the incoming wafer is a processed wafer having one or more films, which are patterned or not patterned.

Then, in some embodiments, an initial warpage value is measured at S502 of FIG. 5. At S503 of FIG. 5, if the measured initial warpage value is within a threshold (e.g., a threshold range), the wafer or substrate is passed to the next manufacturing process at S504 of FIG. 5, for example, a lithography operation. The lithography operation includes ultra violet (UV) lithography (g-line and i-line lithography), deep UV (DUV) lithography (KrF and ArF lithography), extreme UV (EUV) lithography or electron beam lithography. If the measured initial warpage value is not within the threshold, the wafer or substrate is subjected to a cryogenic treatment operation at S505 of FIG. 5. In some embodiments, the condition of the cryogenic treatment operation is predetermined, and in other embodiments, the condition of the cryogenic treatment operation is adjusted according to the measured warpage value. After the cryogenic treatment operation, a warpage value is measured again. If the measured warpage value is within the threshold, the wafer or substrate is passed to the next manufacturing process, and if the measured initial warpage value is not within the threshold, the wafer or substrate is subjected to the cryogenic treatment operation again with the same or modified cryogenic treatment operation condition. The measurement and the cryogenic treatment operation are repeated until the measured warpage value is within the threshold. In some embodiments, during the cryogenic treatment operation, no other manufacturing operation, such as an ion implantation operation, an etching operation, a patterning operation and a film deposition operation, which physically change the structure of the wafer or substrate, is performed.

Figure 6A:
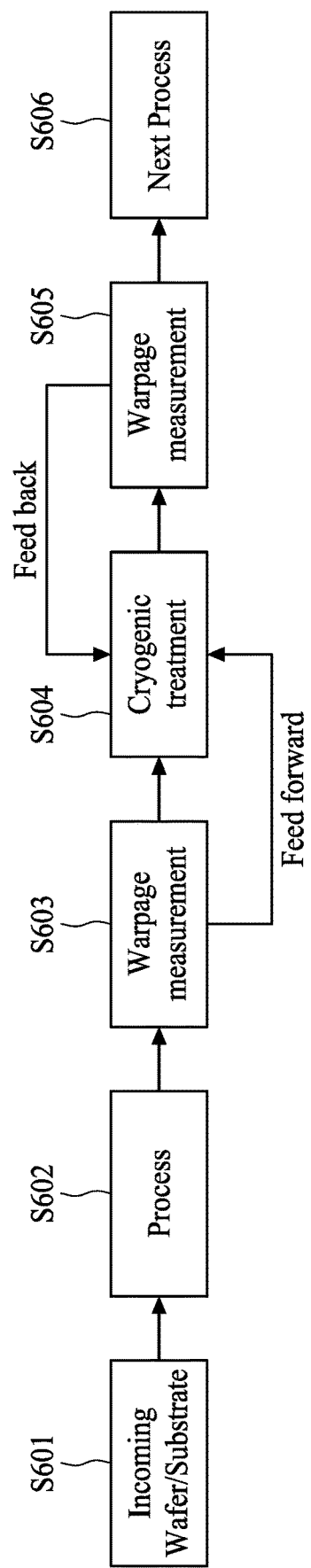
FIGS. 6A and 6B show process flows of a cryogenic treatment during semiconductor device manufacturing operation according to embodiments of the present disclosure.
Figure 6B:
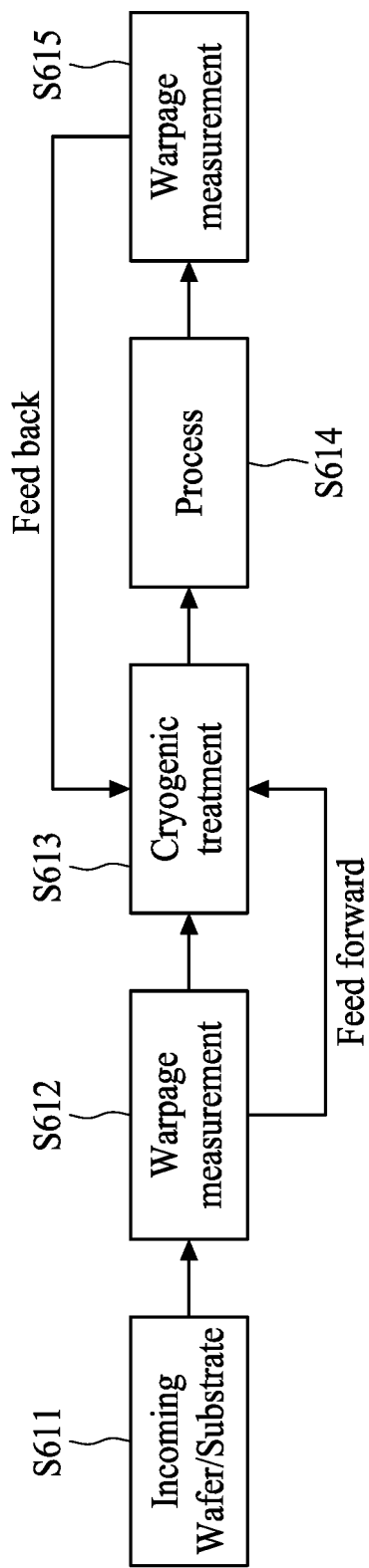

FIGS. 6A and 6B show process flows of a cryogenic treatment during semiconductor device manufacturing operation according to embodiments of the present disclosure.

In some embodiments, as shown in FIG. 6A, the cryogenic treatment operation is performed after a manufacturing process is performed. A wafer or substrate is received as an incoming wafer or substrate at S601. In some embodiments, the incoming wafer is a bare Si wafer before a semiconductor manufacturing process is performed. In some embodiments, the incoming wafer is a processed wafer having one or more films, which are patterned or not patterned.

Then, one or more semiconductor manufacturing operations is performed on the incoming wafer at S602 of FIG. 6A. In some embodiments, the manufacturing operation includes a film formation operation, such as thermal oxidation, CVD, ALD, PVD and any other film formation methods. In some embodiments, the film formation method accompanies a thermal process, in which the wafer is heated at a process temperature suitable for the respective film formation methods. In some embodiments, the process temperature is in a range from about 1000° C. to 1200° C. In some embodiments, the process temperature is in a range from about 800° C. to 1000° C. In some embodiments, the process temperature is in a range from about 500° C. to 800° C. In some embodiments, the process temperature is in a range from about 250° C. to 500° C. In some embodiments, the manufacturing operation includes a planarization operation, such as an etch-back operation or a chemical mechanical polishing operation.

In some embodiments, the manufacturing operation includes a patterning operation, such as a dry etching and a wet etching. In some embodiments, the dry etching includes plasma dry etching or chemical (non-plasma) dry etching. In some embodiments, the dry etching operation includes a thermal process, in which the wafer is heated at a process temperature suitable for the respective dry etching methods. In some embodiments, the process temperature is in a range from about 100° C. to 200° C. In some embodiments, the process temperature is in a range from about 200° C. to 300° C. In some embodiments, the process temperature is in a range from about 300° C. to 400° C. In some embodiments, the process temperature is in a range from about 400° C. to 600° C. In some embodiments, wet etching includes an $H_3PO_4$ etching at a process temperature of about 100° C. to 200° C.

After the film formation operation and/or the patterning operation, the wafer or substrate is cooled down to the room temperature.

At S603 of FIG. 6A, a warpage value is measured. Then, at S604 of FIG. 6A, a cryogenic treatment operation is performed on the wafer. In some embodiments, the condition of the cryogenic treatment operation is predetermined, and in other embodiments, the condition of the cryogenic treatment operation is adjusted according to the measured warpage value (feed forward). After the cryogenic treatment operation, a warpage value is optionally measured again at S605 in some embodiments. If the measured warpage value is within the threshold, the wafer or substrate is passed to the next manufacturing process at S606, and if the measured initial warpage value is not within the threshold, the wafer or substrate is subjected to the cryogenic treatment operation again with the same or modified cryogenic treatment operation condition. The measurement and the cryogenic treatment operation are repeated until the measured warpage value is within the threshold. In other embodiments, if the measured warpage value is outside the desired range, the wafer is scrapped or no subsequent operation is performed. In other embodiments, after the cryogenic treatment operation, the wafer is passed to the next manufacturing operation without measuring the warpage value at S605. In some embodiments, the measured results at S605 is fed back to S604 for a subsequent wafer subjected to the cryogenic treatment operation.

In some embodiments, the next manufacturing operation S606 includes a lithography operation, a measurement operation, a cleaning operation, a thermal operation (annealing), a film formation operation, an etching operation and/or an ion implantation operation.

In some embodiments, as shown in FIG. 6B, the cryogenic treatment operation is performed before a manufacturing process is performed. A wafer or substrate is received as an incoming wafer or substrate at S611. In some embodiments, the incoming wafer is a bare Si wafer before a semiconductor manufacturing process is performed. In some embodiments the incoming wafer is a processed wafer having one or more films, which are patterned or not patterned.

At S612 of FIG. 6B, a warpage value is measured. Then, at S613 of FIG. 6B, a cryogenic treatment operation is performed on the wafer. In some embodiments, the condition of the cryogenic treatment operation is predetermined, and in other embodiments, the condition of the cryogenic treatment operation is adjusted according to the measured warpage value (feed forward). After the cryogenic treatment operation, a warpage value is optionally measured again in some embodiments. If the measured warpage value is within the threshold, the wafer or substrate is passed to the next manufacturing process at S614, and if the measured initial warpage value is not within the threshold, the wafer or substrate is subjected to the cryogenic treatment operation again with the same or modified cryogenic treatment operation condition. The measurement and the cryogenic treatment operation are repeated until the measured warpage value is within the threshold. In other embodiments, if the measured warpage value is out of the desired range, the wafer is scrapped or no subsequent operation is performed.

In some embodiments, after the warpage measurement, the wafer is passed to the next manufacturing process without repeating the cryogenic treatment operation. In other embodiments, after the cryogenic treatment operation, the wafer is passed to the next manufacturing process without measuring the warpage value.

Then, at S614 of FIG. 6B, one or more semiconductor manufacturing operation is performed on the incoming wafer. In some embodiments, the manufacturing operation includes a film formation operation, such as thermal oxidation, CVD, ALD, PVD and any other film formation methods. In some embodiments, the film formation method includes a thermal process, in which the wafer is heated at a process temperature suitable for the respective film formation methods. In some embodiments, the process temperature is in a range from about 1000° C. to 1200° C. In some embodiments, the process temperature is in a range from about 800° C. to 1000° C. In some embodiments, the process temperature is in a range from about 500° C. to 800° C. In some embodiments, the process temperature is in a range from about 250° C. to 500° C.

In some embodiments, the manufacturing operation includes a patterning operation, such as a dry etching and a wet etching. In some embodiments, the dry etching includes plasma dry etching or chemical (non-plasma) dry etching. In some embodiments, the dry etching operation includes a thermal process, in which the wafer is heated at a process temperature suitable for the respective dry etching methods. In some embodiments, the process temperature is in a range from about 100° C. to 200° C. In some embodiments, the process temperature is in a range from about 200° C. to 300° C. In some embodiments, the process temperature is in a range from about 300° C. to 400° C. In some embodiments, the process temperature is in a range from about 400° C. to 600° C. In some embodiments, wet etching includes an $H_3PO_4$ etching at a process temperature of about 100° C. to 200° C.

After the film formation operation and/or the patterning operation, the wafer or substrate is cooled down to the room temperature.

In some embodiments, the measured results at S615 is fed back to S613 for the subsequent wafer subjected to the cryogenic treatment operation.

Figure 7:
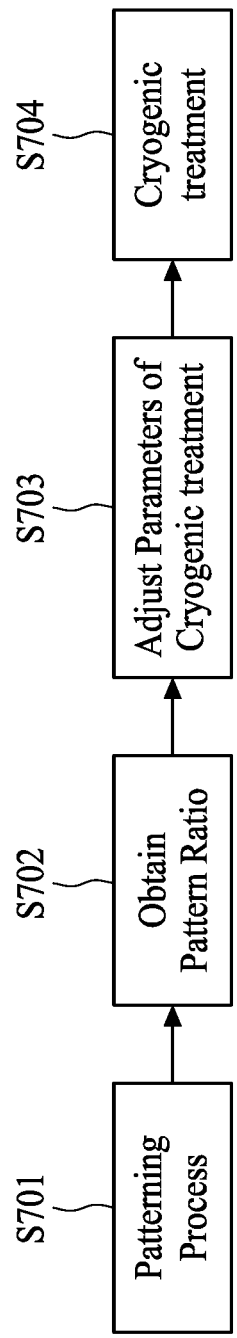
FIG. 7 shows a process flow of a cryogenic treatment during semiconductor device manufacturing operation according to an embodiment of the present disclosure.

FIG. 7 shows a process flow of a cryogenic treatment during semiconductor device manufacturing operation according to an embodiment of the present disclosure.

In some embodiments, a film (e.g., conductive film) is formed over a wafer and then patterning operation including one or more lithography and etching operations is performed, at S701 of FIG. 7. Depending on the pattern ratio (the total area of the remaining patterns over the total etched areas), the warpage value varies. In some embodiments, at S702 of FIG. 7. The pattern ratio of the operation S701 is obtained. The pattern ratio can be obtained from design layout data for a mask pattern used in the patterning operation. Then, at S703 of FIG. 7, based on the pattern ratio, one or more of the parameters of the cryogenic treatment operation are adjusted or determined. At S704 of FIG. 7, based on the adjusted parameters, the cryogenic treatment operation is performed. In some embodiments, one or more manufacturing operations are performed between S701 and S703.

Figure 8A:
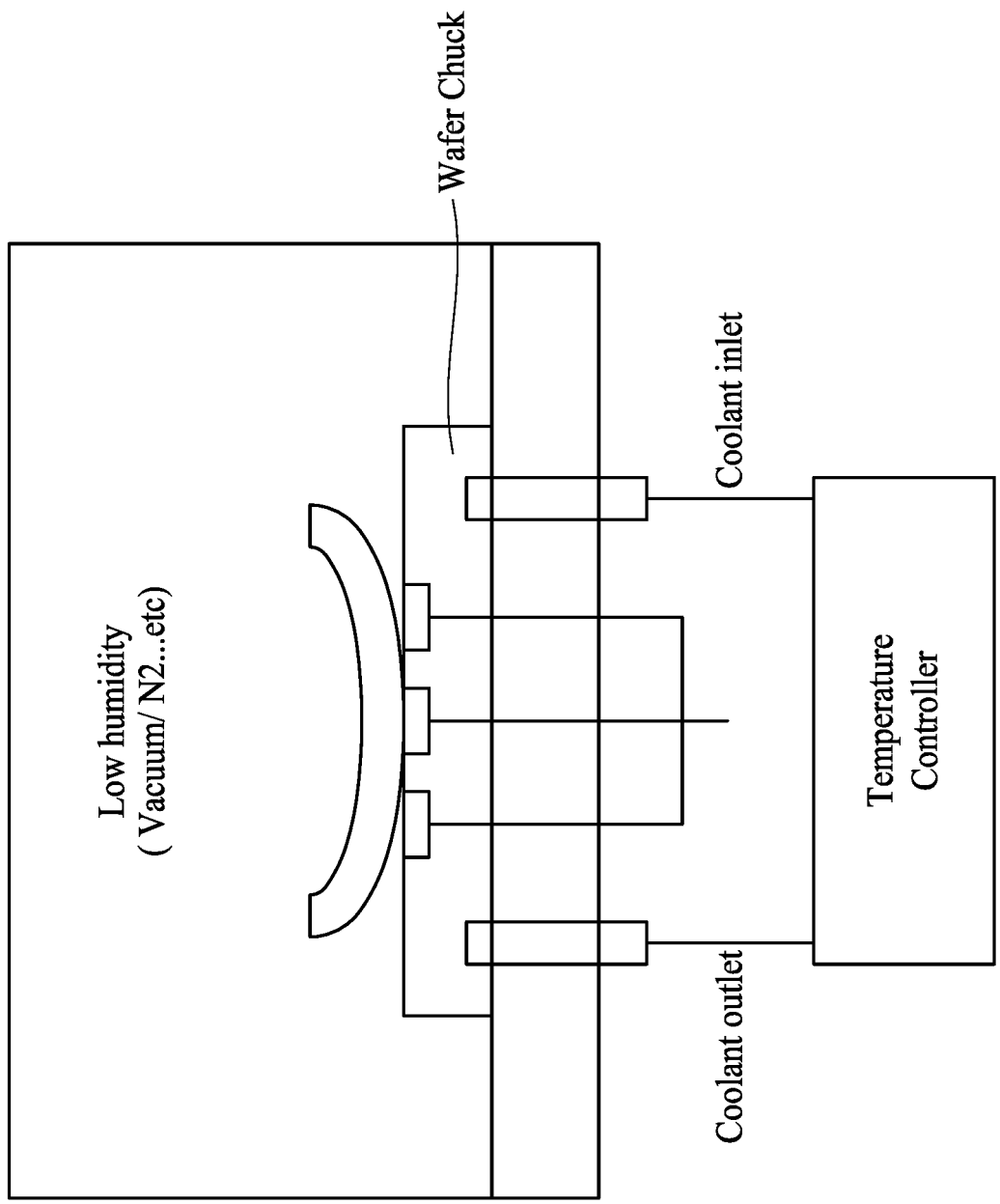
FIGS. 8A, 8B and 8C show apparatuses for a cryogenic treatment according to embodiments of the present disclosure.
Figure 8B:
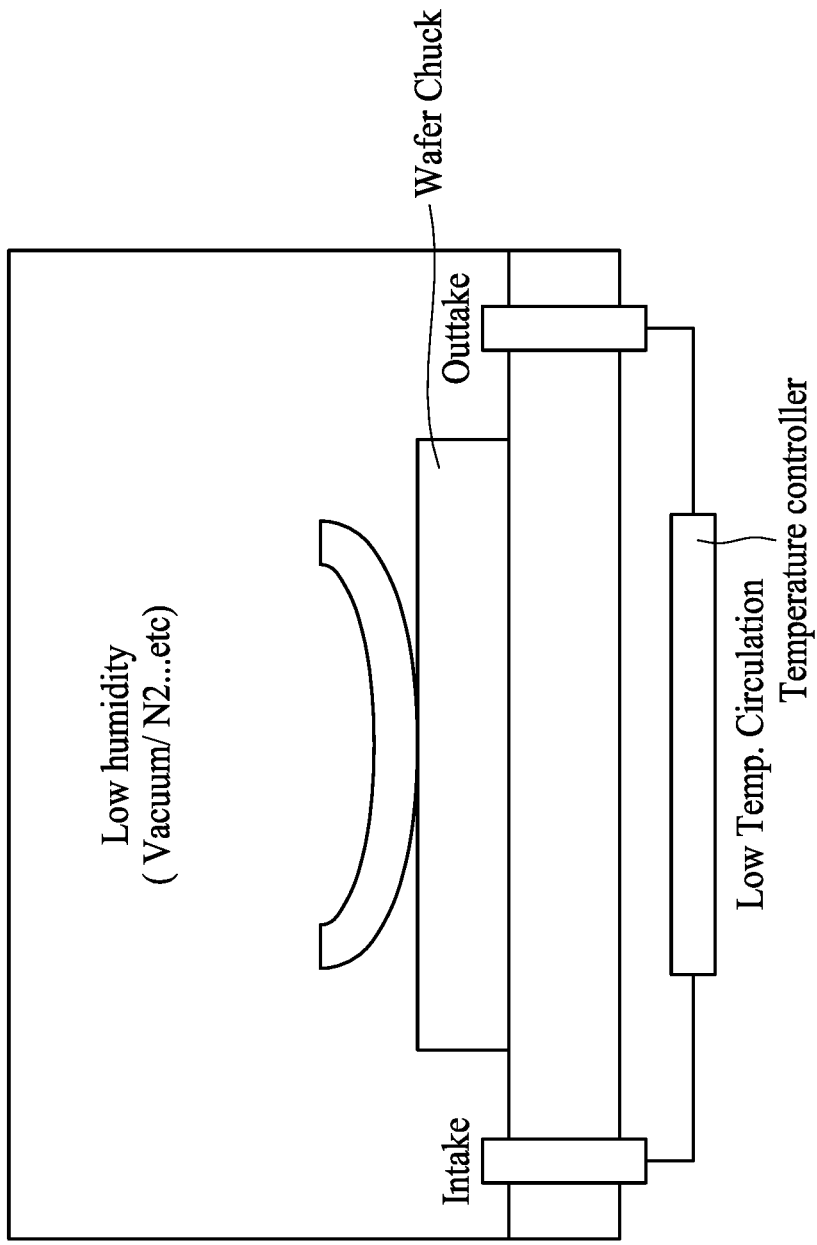
Figure 8C:
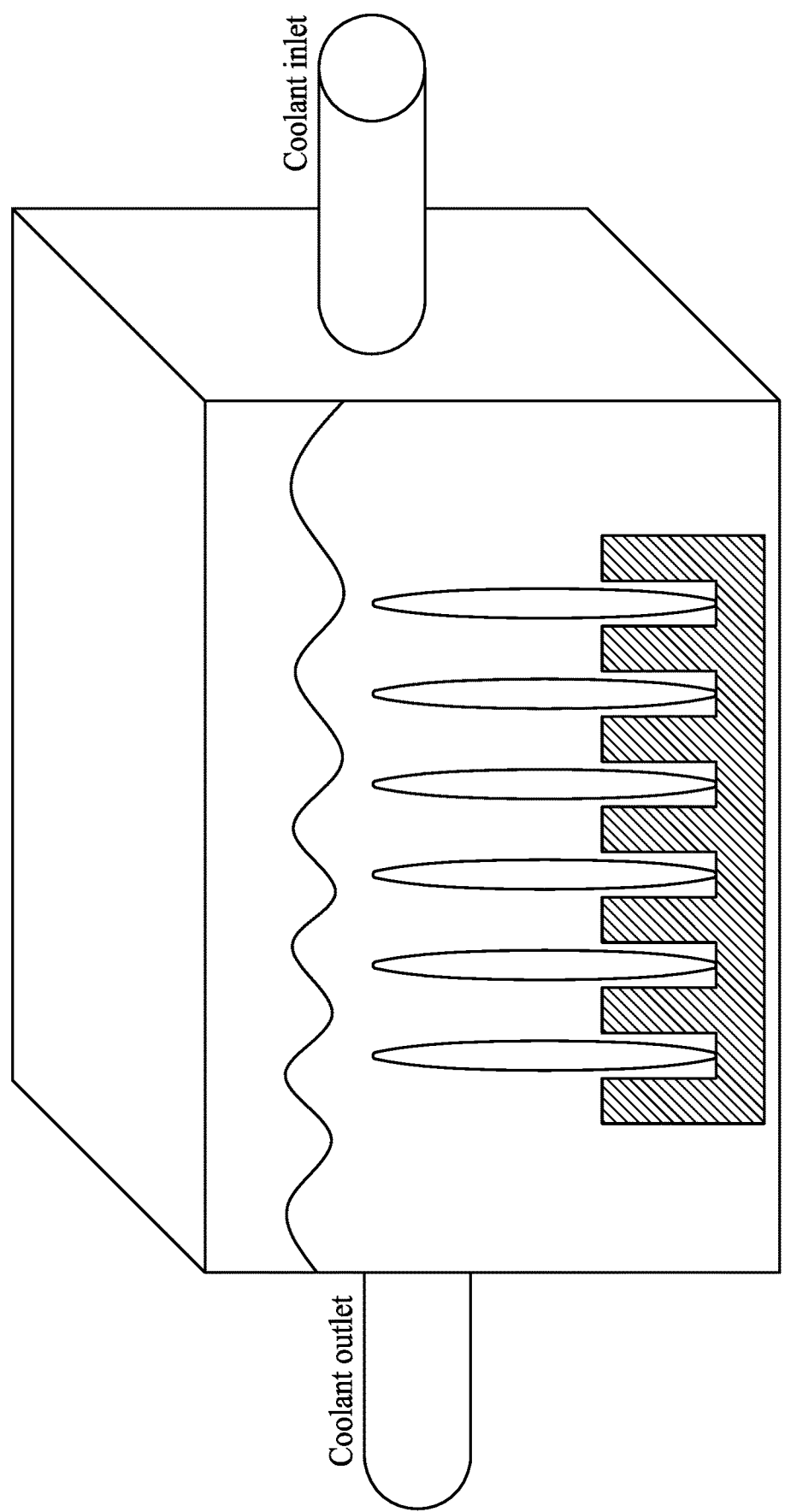

FIGS. 8A, 8B and 8C show apparatuses for a cryogenic treatment according to embodiments of the present disclosure.

In some embodiments, an apparatus for cryogenic treatment is a contact type apparatus as shown in FIG. 8A. In the contact type apparatus, a subject structure (wafer or substrate) is placed on a cooled stage which is cooled by coolant. In some embodiments, the coolant includes liquid and/or cooled gaseous nitrogen, oxygen and/or helium, cooled carbon dioxide, cooled hydrocarbon, or any other suitable coolant. In some embodiments, the coolant is circulated by a pump and temperature controlled by a temperature controller, during the cryogenic treatment operation. The temperature of the stage is controlled by the temperature controller. In some embodiments, the temperature of the coolant is controlled by, for example, mixing liquid nitrogen with gaseous nitrogen and/or heating/cooling the stage by electric heater or a Peltier device. The chamber is under vacuum in some embodiments. In other embodiments, the chamber is filled with dry gas, such as dry inert gas. The humidity of the dry gas is controlled below a dew point at the temperature of the gas filled in the chamber.

In other embodiments, an apparatus for cryogenic treatment is an ambient type apparatus as shown in FIG. 8B. A cooled gas is introduced into a chamber. The cooled gas includes one or more of air, nitrogen, carbon dioxide, oxygen, helium, hydrocarbon, and any other suitable gas. The humidity of the gas is controlled below the dew point. In some embodiments, the cooled gas is circulated by a pump and temperature controlled by a temperature controller, during the cryogenic treatment operation. The temperature of the gas is controlled by the temperature controller. The temperature controlling methods of FIGS. 8A and 8B are used together in some embodiments.

In other embodiments, an apparatus for cryogenic treatment is a dipping bus type as shown in FIG. 8C. In some embodiments, a coolant, such as liquid nitrogen or other suitable coolant is stored in a bus, which has an inlet and an outlet, and one or more wafers subjected to the cryogenic treatment operation are dipped into the coolant. In some embodiments, the speed of dipping the wafers stored in a wafer cassette or a holder into the coolant liquid is a controlled parameter. In some embodiments, the wafer cassette holding one or more wafers is held above an upper surface of the coolant (e.g., liquid nitrogen) to cool the wafer without dipping.

In some embodiments, an apparatus for cryogenic treatment according to the embodiments of the present disclosure is a stand-alone apparatus or integrated in another apparatus, such as a film deposition apparatus, a plasma treatment apparatus or any other semiconductor manufacturing apparatuses.

In some embodiments, during the cryogenic treatment operation, the wafer is not fixed or clamped to the wafer stage so that the wafer is free from an external force. In other embodiments, during a part of or all of the cryogenic treatment operation, the wafer is tightly fixed to the wafer stage by, for example, a clamp or an electrostatic chucking mechanism. In some embodiments, during at least one of the periods P1, P2, P3 and P4 shown in FIG. 1B, the wafer is free from external force. In some embodiments, during the cooling down period (P1 of FIG. 1B), the wafer is free from an external force (no chucking) and the wafer is chucked to the wafer stage in the remaining period (P2, P3 of FIG. 1B) of the cryogenic treatment operation. In other embodiments, during the holding period (P2 of FIG. 1B), the wafer is free from an external force and the wafer is chucked to the wafer stage in the remaining period (P1, P3 of FIG. 1B). In other embodiments, during the heating up period (P3 of FIG. 1B), the wafer is free from an external force and the wafer is chucked to the wafer stage in the remaining period (P1, P2 of FIG. 1B).

In other embodiments, the cryogenic treatment operation is applied to packaging and/or assembling operations, such as a back grinding process, a dicing process, a burning-in process, a molding process, a wire-boding process and the like.

In some embodiments, after the operations on the wafer are finished, the wafer is thinned by grinding the back side of the wafer. In some embodiments, before and/or after the grinding, the cryogenic treatment operation is performed to reduce warpage or internal stress. Then the thinned wafer is attached to an adhesive film with a frame, and then subjected to dicing to separate the wafer into a plurality of chips. In some embodiments, before and/or after the dicing, the wafer or chips attached to the adhesive film is subjected to the cryogenic treatment operation to reduce warpage or internal stress. In some embodiments, a dipping bus as shown in FIG. 8C is used to perform the cryogenic treatment operation.

After the dicing, each chip (die) is picked up and passed to a die-bonding operation to attach the chip to a lead frame and bonding the chip to the leads by wires. After a wire-bonding operation, the chip and the lead frame are molded by a resin. In some embodiments, before and/or after the molding operation, a cryogenic treatment operation is performed to reduce warpage or internal stress. Further, in some embodiments, an interposer is attached to the molded chip to attach the molded chip to another substrate, such as a wiring board. Before and/or after the attachment of the interposer, a cryogenic treatment operation is performed to reduce warpage or internal stress.

It will be understood that not all advantages have been necessarily discussed herein, no particular advantage is required for all embodiments or examples, and other embodiments or examples may offer different advantages.

According to one aspect of the present disclosure, in a method of manufacturing an electronic device, a structure including two or more materials having different coefficients of thermal expansion is prepared, and the structure is subjected to a cryogenic treatment. During the cryogenic treatment, no other manufacturing operation is performed. In one or more of the foregoing and following embodiments, the structure includes a semiconductor wafer and one or more layers are formed on the semiconductor wafer. In one or more of the foregoing and following embodiments, the cryogenic treatment includes cooling the structure to a first temperature in a range from −10° C. to −273° C., holding the structure at the first temperature for a time duration in a range from about 0.1 min about 120 min, and heating the structure from the first temperature to a second temperature higher than 0° C. In one or more of the foregoing and the following embodiments, the time duration is in a range from about 1 min to about 60 min. In one or more of the foregoing and following embodiments, the first temperature is in a range from −10° C. to −100° C. In one or more of the foregoing and following embodiments, the first temperature is in a range from −50° C. to −200° C. In one or more of the foregoing and following embodiments, at least one of the cooling or the heating comprises changing the temperature in a stepwise manner. In one or more of the foregoing and following embodiments, one or more semiconductor manufacturing operations are performed before the cryogenic treatment. In one or more of the foregoing and following embodiments, the one or more semiconductor manufacturing operations include a thermal operation at a temperature at 200° C. or more. In one or more of the foregoing and following embodiments, the one or more semiconductor manufacturing operations include a patterning operation. In one or more of the foregoing and following embodiments, one or more semiconductor manufacturing operations are performed before the cryogenic treatment. In one or more of the foregoing and following embodiments, the one or more semiconductor manufacturing operations include a lithography operation.

In accordance with another aspect of the present disclosure, in a method of manufacturing a semiconductor device, a first manufacturing operation is performed on or over a substrate, a second manufacturing operation is performed on or over the substrate, and a cryogenic treatment operation is performed between the first and second manufacturing operation. At least one of the first and second manufacturing operations includes a thermal operation at a temperature at 200° C. or more. During the cryogenic treatment, no other manufacturing operation is performed. In one or more of the foregoing and following embodiments, the cryogenic treatment includes cooling the structure to a first temperature in a range from −10° C. to −273° C., holding the structure at the first temperature for a time duration in a range from 0.1 min to 120 min, and heating the structure from the first temperature to a second temperature higher than 0° C. In one or more of the foregoing and following embodiments, a cooling rate in the cooling is in a range from −0.1° C./min to −100° C./min. In one or more of the foregoing and following embodiments, a heating rate in the heating is in a range from 0.1° C./min to 100° C./min. In one or more of the foregoing and following embodiments, the first temperature is controlled by at least one of controlling a temperature of a stage on which the substrate is placed or controlling a temperature of an ambient of a chamber in which the substrate is placed. In one or more of the foregoing and following embodiments, after the cryogenic treatment operation, the substrate comprises warpage of a non-zero value.

In accordance with another aspect of the present disclosure, in a method of manufacturing a semiconductor device, a first manufacturing operation is performed on or over a substrate, a warpage value of the substrate is measured after the first manufacturing operation, a second manufacturing operation is performed on or over the substrate, and a cryogenic treatment operation is performed between the first and second manufacturing operation. The measurement the warpage value is performed before or after the cryogenic treatment operation is performed. In one or more of the foregoing and following embodiments, the measurement the warpage value is performed before the cryogenic treatment operation is performed, and the method further comprises adjusting one or more parameters of the cryogenic treatment operation based on the measured warpage value. In one or more of the foregoing and following embodiments, the measurement the warpage value is performed before the cryogenic treatment operation is performed, and when the measured warpage value is out of a threshold range, performing an additional cryogenic treatment operation, and when the measured warpage value is within the threshold range, performing the second manufacturing operation. In one or more of the foregoing and following embodiments, the first manufacturing operation includes one or more of a film formation process, an etching process, a planarization process, and a thermal process, and the second manufacturing operation includes an EUV lithography operation.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an electronic device, comprising:
    preparing a structure including two or more materials having different coefficients of thermal expansion;
    measuring warpage of the structure;
    determining whether the warpage is within a threshold range; and
    when the warpage is outside the threshold range, subjecting the structure to a cryogenic treatment using a gaseous coolant, wherein:
    during the cryogenic treatment operation, none of an ion implantation operation, an etching operation, a patterning operation and a film deposition operation is performed, and
    the cryogenic treatment includes cooling the structure to a first temperature in a range from −10° C. to −100° C.

2. The method of claim 1, wherein the structure includes a semiconductor wafer and one or more layers are formed on the semiconductor wafer.

3. The method of claim 1, wherein the cryogenic treatment includes:
    holding the structure at the first temperature for a time duration in a range from 1 min to 60 min; and
    heating the structure from the first temperature to a second temperature higher than 0° C.

4. The method of claim 1, wherein the first temperature is in a range from −30° C. to −100° C.

5. The method of claim 3, wherein at least one of the cooling or the heating comprises changing the temperature in a stepwise manner.

6. The method of claim 1, further comprising performing one or more semiconductor manufacturing operations before the cryogenic treatment.

7. The method of claim 6, wherein the one or more semiconductor manufacturing operations include a thermal operation at a temperature of at least 200° C.

8. The method of claim 6, wherein the one or more semiconductor manufacturing operations include a patterning operation.

9. The method of claim 1, further comprising performing one or more semiconductor manufacturing operations after the cryogenic treatment.

10. The method of claim 9, wherein the one or more semiconductor manufacturing operations include a lithography operation.

11. A method of manufacturing a semiconductor device, the method comprising:
    performing a first manufacturing operation on or over a substrate;
    measuring warpage of the substrate;
    determining whether the warpage is within a threshold range;
    when the warpage is outside the threshold range performing a cryogenic treatment operation including cooling the substrate to a first temperature in a range from −10° C. to −273° C. after the first manufacturing operation; and
    performing a second manufacturing operation on or over the substrate after performing the cryogenic treatment operation, wherein:
    during the cryogenic treatment operation, no ion implantation operation is performed, and
    the second manufacturing operation includes a film formation operation performed at a temperature of 250° C. or more or an etching operation performed at a temperature of 200° C. or more.

12. The method of claim 11, wherein the cryogenic treatment further includes
    holding the substrate at the first temperature for a time duration in a range from 0.1 min to 120 min; and
    heating the substrate from the first temperature to a second temperature higher than 0° C.

13. The method of claim 12, wherein a cooling rate during the cooling is in a range from −0.1° C./min to −100° C./min.

14. The method of claim 12, wherein a heating rate during the heating is in a range from 0.1° C./min to 100° C./min.

15. The method of claim 12, wherein the first temperature is controlled by at least one of controlling a temperature of a stage on which the substrate is placed or controlling a temperature of an ambient of a chamber in which the substrate is placed.

16. The method of claim 11, wherein the second manufacturing operation includes an etching operation performed at a temperature of 200° C. or more.

17. A method of manufacturing an electronic device, comprising:
    preparing a substrate including two or more materials having different coefficients of thermal expansion; and
    performing a first manufacturing operation on or over the substrate;
    measuring warpage of the substrate;
    determining whether the warpage is within a threshold range;
    when the warpage is outside the threshold range performing a cryogenic treatment operation including cooling the substrate to a first temperature in a range from −10° C. to −273° C. after the first manufacturing operation; and
    performing a second manufacturing operation on or over the substrate after performing the cryogenic treatment operation, wherein:
    during the cryogenic treatment operation, none of an ion implantation operation, an etching operation, a patterning operation and a film deposition operation is performed, and
    at least one of the first and second manufacturing operations includes a film formation operation performed at a temperature of 250° C. or more or an etching operation performed at a temperature of 200° C. or more.

18. The method of claim 17, wherein the cryogenic treatment further includes
    heating the structure from the first temperature to a second temperature higher than 0° C.

19. The method of claim 18, wherein in the cryogenic treatment, the structure is held at the first temperature for a time duration in a range from 0.1 min to 120 min.

20. The method of claim 17, wherein the first manufacturing operation includes a thermal operation at a temperature of 200° C. or more.

* * * * *